United States Patent [19]

Hedman

[11] Patent Number: 4,698,599

[45] Date of Patent: Oct. 6, 1987

[54] DIFFERENTIAL SUMMING AMPLIFIER FOR INPUTS HAVING LARGE COMMON MODE SIGNALS

[75] Inventor: Robert L. Hedman, Rochester, Minn.

[73] Assignee: International Business Machines Corporation, Armonk, N.Y.

[21] Appl. No.: 873,228

[22] Filed: Jun. 11, 1986

[51] Int. Cl.$^4$ .............................................. H03F 3/45
[52] U.S. Cl. ..................................... 330/252; 330/69; 330/258; 330/259
[58] Field of Search .................. 330/69, 252, 258, 259, 330/261, 310

[56] References Cited

U.S. PATENT DOCUMENTS 3,660,773  5/1972  Free ................................... 330/69 X
3,868,583  2/1975  Krabbe ............................. 330/69 X

FOREIGN PATENT DOCUMENTS 3310978  8/1983  Fed. Rep. of Germany ...... 330/252

Primary Examiner—Eugene R. LaRoche
Assistant Examiner—Steven J. Mottola
Attorney, Agent, or Firm—J. Michael Anglin

[57] ABSTRACT

Differential input voltages are converted into current unbalances in a parallel-branch circuit. A load means converts the sum of the current unbalances to a differential voltage representing the sum of the input voltages.

9 Claims, 1 Drawing Figure

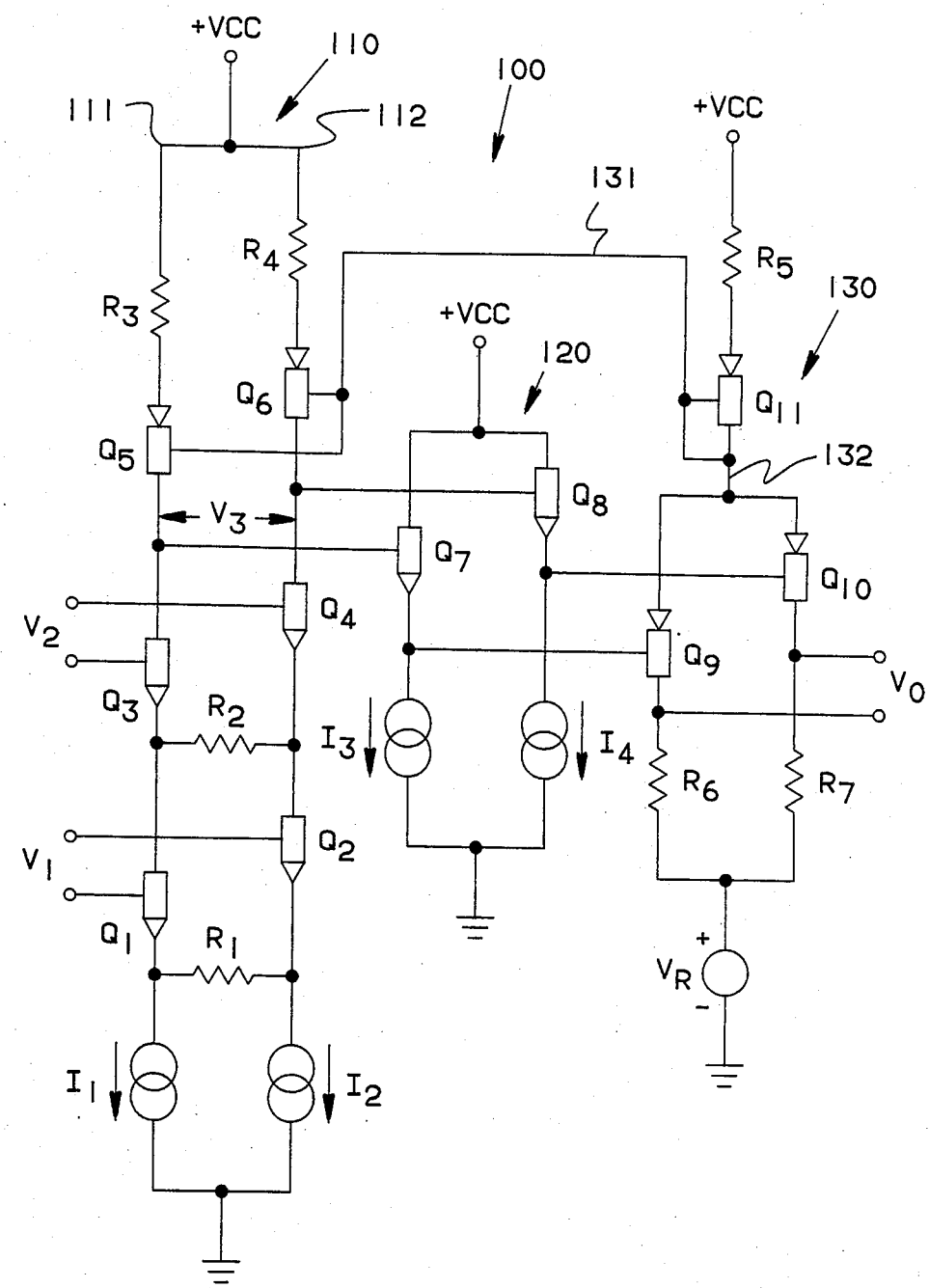

DIFFERENTIAL SUMMING AMPLIFIER FOR INPUTS HAVING LARGE COMMON MODE SIGNALS

BACKGROUND OF THE INVENTION

The present invention relates to solid-state amplifier circuits, and particularly concerns a summing-amplifier design tolerating large common-mode voltages on its inputs.

Frequently, two differential voltage signals must be summed in an environment where they may be separated by a large common-mode voltage. One representative application for such a circuit is in a voice-coil driver for a servo system of a magnetic disk drive.

Previous circuits for performing such a function employ precision resistor networks and additional amplifiers for isolating the input signals from each other, matching impedances, and proper scaling. Such circuits are expensive, complex, or inaccurate.

SUMMARY OF THE INVENTION

The present invention provides a simple, inexpensive circuit for producing an output signal proportional to the sum (or difference) of multiple differential input signals, even when those inputs are separated by a large and variable common-mode signal. The circuit includes a substantial amount of gain and isolation (buffering) from input to output. The circuit can be easily included in a larger feedback amplifier if desired.

The circuit operates by converting each input signal into a proportional current unbalance in a balanced parallel-branch input stage. The current unbalances produced by each input are additive, and are output by sensing the amount of current unbalance. This can be done with load means for converting the current unbalance into a differential voltage. Intermediate and output stages may be included for isolation, gain, and bias-level adjustment.

BRIEF DESCRIPTION OF THE DRAWING

The single Figure is a circuit diagram of an amplifier constructed according to the present invention.

DETAILED DESCRIPTION OF A PREFERRED EMBODIMENT

In the Figure, amplifier 100 has a summing stage 110, a buffer stage 120, and an output stage 130.

Input stage 110 receives two differential input voltages V1 and V2, and converts them to a voltage V3 by superposition of currents in its two branches, 111 and 112. Current sources I1 and I2 are identical. In the absence of any differential input voltages, equal currents flow between the supply potentials Vcc and ground through the two branches. This remains true even in the presence of a large and variable common-mode voltage difference between V1 and V2. (The common-mode voltage of V1 is defined as the voltage between ground potential and the average of the voltages on the two input terminals marked V1. The common-mode voltages of V2 and V3 are defined similarly.) A differential input voltage between the two terminals marked V1 appears between the bases of NPN transistors Q1 and Q2. This produces a current in current-transfer resistor R1 proportional to the differential portion of V1, and thereby unbalances the branch currents by an amount V1/R1, in a direction determined by the polarity of that input voltage. Differential input voltage V2 appears between the bases of another pair of NPN transistors, Q3 and Q4. V2 produces a current in another current-transfer means R2, unbalancing the branch currents by V2/R2. Thus, the total difference between the currents in branches 111 and 112 follows the weighted sum of the two input voltages. The voltage across each branch load means Q5, R3 and Q6, R4 is proportional to the current through it. Thus, the differential voltage V3 between the collectors of Q3 and Q4 is a sum signal $V3 = (V1/R1 + V2/R2)*Z$, where Z represents an effective impedance between the bases of transistors Q7 and Q8. The value of Z is normally quite large, on the order of 10K to 100K Ohms. This large impedance provides high gain and a good compensation point, both attributes being useful when this circuit forms a part of a feedback amplifier. The values of R1 and R2 may be fixed in the circuit chip, or they could be programmable or made external for scaling by the user. R3 and R4 help to balance the branches 111 and 112 by swamping out variations between the characteristics of load transistors Q5 and Q6; their value is not critical to the operation of the invention.

Buffer stage stage 120, having NPN transistors Q7, Q8 and current sources I1, I2, provide isolation for the low-beta PNP transistors Q9, Q10 of stage 130.

Balanced output stage 130 provides additional gain, and also contributes to a self-biasing control loop for the load means of input stage 110. The summed output voltage Vo is taken from between the collectors of transistors Q9 and Q10. An arbitrary reference voltage Vr provides any desired offset or common voltage from the circuit ground potential. This voltage may be generated on-chip or externally by any of a number of conventional means. Passive loads R6 and R7 are used in stage 130.

Stage 130 also functions as a self-biasing control loop to set the relative bias levels of stages 110 and 130. This is done by transferring a voltage proportional to the common-mode level of V3 via direct coupling through stages 120 and 130 to a control means formed by Q11 and R5. Line 131 then returns a control signal representing this common-mode voltage to the bases of Q5 and Q6. Thus, for example, if the common-mode voltage of V3 falls, the voltage at the collector of Q11 falls, and this lower voltage on line 131 causes more current to flow through Q5 and Q6, bringing the common-mode voltage of V3 back up.

In some applications it may be desirable to adjust the common-mode level of V3. This can be done by inserting a resistor (not shown) in line 132. This creates a voltage difference between the voltage reaching stage 130 and the voltage fed back on line 131.

Amplifier 100 can be part of a larger feedback amplifier circuit (not shown) on the same or a different chip. Other types of transistors can be used, and such elements as the current sources may be implemented in any of a number of ways known to the art. Additional inputs can be accommodated by stacking additional input-transistor pairs and resistors in stage 110. The sum signal represented by V3 could be other than a voltage, such as one or more currents. The range of applications for this type of circuit is very wide.

Having described a preferred embodiment thereof, I claim as my invention:

1. A summing amplifier for summing multiple differential input voltages having different common-mode voltages, said amplifier having an input stage comprising:
- a pair of supply voltages;
- first and second branches in parallel between said supply voltages, each of said branches having in series
  - a current source,
  - a first input transistor having an input terminal coupled to a first of said input voltages,
  - a second input transistor having an input terminal coupled to a second of said input voltages,
- first current-transfer means coupled to said first input transistor in each of said branches for transferring from one of said branches to the other of said branches a current whose magnitude is proportional to said first input voltage;
- second current-transfer means coupled to said second input transistor in each of said branches for transferring from one of said branches to the other of said branches a current whose magnitude is proportional to said second input voltage;
- load means for producing a sum signal whose magnitude is related to the difference between first and second branch currents flowing in said first and second branches respectively.

2. An amplifier according to claim 1, wherein said first and second current transfer means comprise resistors.

3. An amplifier according to claim 1, wherein said load means comprise means for converting said difference between said first and second branch currents to a voltage difference between first and second points in said first and second branches respectively.

4. An amplifier according to claim 1, wherein said current sources in said first and second branches produce currents equal to each other.

5. An amplifier according to claim 1, further comprising:
- an intermediate stage for amplifying said sum signal.

6. An amplifier according to claim 5, wherein said intermediate stage comprises:
- a pair of parallel branches coupled to said load means for differentially amplifying and buffering said sum signal.

7. An amplifier according to claim 1, further comprising an output stage having:
- means for amplifying said sum signal so as to produce an output signal;
- reference means for adding a common-mode reference voltage to said output signal.

8. An amplifier according to claim 1, further comprising a bias-control loop having:
- means for amplifying said sum signal so as to produce an output signal;
- means for producing a control signal representing a common-mode portion in said output signal;
- means for adjusting a bias level of said sum signal in response to said control signal.

9. An amplifier according to claim 8, wherein said load means of said input stage are responsive to said control signal for adjusting said bias level.

* * * * *